United States Patent
Loeken et al.

(10) Patent No.: US 8,227,777 B2
(45) Date of Patent: Jul. 24, 2012

(54) METHOD AND APPARATUS FOR OPERATING AN ELECTRICAL DISCHARGE DEVICE

(75) Inventors: Michael Loeken, Juelich (DE); Jakob Willi Neff, Kelmis (BE); Juergen Klein, Aachen (DE); Sven Probst, Aachen (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 660 days.

(21) Appl. No.: 11/720,638

(22) PCT Filed: Nov. 29, 2005

(86) PCT No.: PCT/IB2005/053946
§ 371 (c)(1),
(2), (4) Date: Jun. 1, 2007

(87) PCT Pub. No.: WO2006/059275
PCT Pub. Date: Jun. 8, 2006

(65) Prior Publication Data
US 2009/0173896 A1  Jul. 9, 2009

(30) Foreign Application Priority Data
Dec. 4, 2004  (DE) .......................... 10 2004 058 500

(51) Int. Cl.
*A61N 2/00* (2006.01)
(52) U.S. Cl. .................................. 250/504 R; 250/493.1
(58) Field of Classification Search ........................ None
See application file for complete search history.

(56) References Cited

U.S. PATENT DOCUMENTS

| | | | | |
|---|---|---|---|---|
| 4,368,538 A * | 1/1983 | McCorkle | ...................... | 378/122 |
| 4,635,282 A * | 1/1987 | Okada et al. | ..................... | 378/34 |
| 4,771,447 A * | 9/1988 | Saitoh et al. | .................. | 378/119 |
| 5,663,611 A * | 9/1997 | Seats et al. | ..................... | 313/584 |
| 6,576,917 B1* | 6/2003 | Silfvast | ...................... | 250/504 R |
| 6,728,337 B2* | 4/2004 | McGeoch | ...................... | 378/119 |
| 7,136,141 B2 * | 11/2006 | Bakker | ............................ | 355/30 |
| 7,157,854 B1* | 1/2007 | Wedding | ........................ | 313/582 |
| 7,456,571 B1* | 11/2008 | Wedding | ........................ | 313/582 |
| 2002/0014598 A1* | 2/2002 | Melnychuk et al. | ....... | 250/504 R |
| 2002/0186815 A1* | 12/2002 | McGeoch | ...................... | 378/119 |
| 2004/0141165 A1* | 7/2004 | Zukavishvili et al. | .......... | 355/53 |
| 2007/0001571 A1* | 1/2007 | Bosch et al. | ............. | 313/231.31 |

FOREIGN PATENT DOCUMENTS

DE  10139677 A1  10/2002
EP  0894349 B1  2/1999
(Continued)

*Primary Examiner* — Nimeshkumar Patel
*Assistant Examiner* — Andrew Smyth
(74) *Attorney, Agent, or Firm* — Mark L. Beloborodov

(57) ABSTRACT

The present invention relates to a method of operating an electrical discharge device (12) comprising at least one first electrode (14) and at least one second electrode (16) at a distance therefrom, which electrodes are electrically connected to a power supply (18) and, upon ignition of a first gas discharge (22) between the electrodes (14, 16), transmit an electrical current (I), as a result of which a plasma (24) is produced in a working gas (26), which plasma emits radiation (28), in particular extreme ultraviolet and/or soft X-ray radiation, which is passed via a solid angle (30) into a chamber (32) outside the electrodes (14, 16). In order to prevent erosion at the electrodes (14, 16), it is proposed that the formation of a secondary plasma (34) in the chamber (32) is suppressed by a device (42).

25 Claims, 7 Drawing Sheets

FOREIGN PATENT DOCUMENTS

| | | | | |
|---|---|---|---|---|
| EP | 1434095 A1 | * | 6/2004 | |
| JP | 61173496 A | * | 8/1986 | |
| JP | 63048799 A | * | 3/1988 | |
| JP | 02078199 A | * | 3/1990 | |
| JP | 2002014598 A | * | 1/2002 | |
| JP | 2004141165 A | * | 5/2004 | |

* cited by examiner

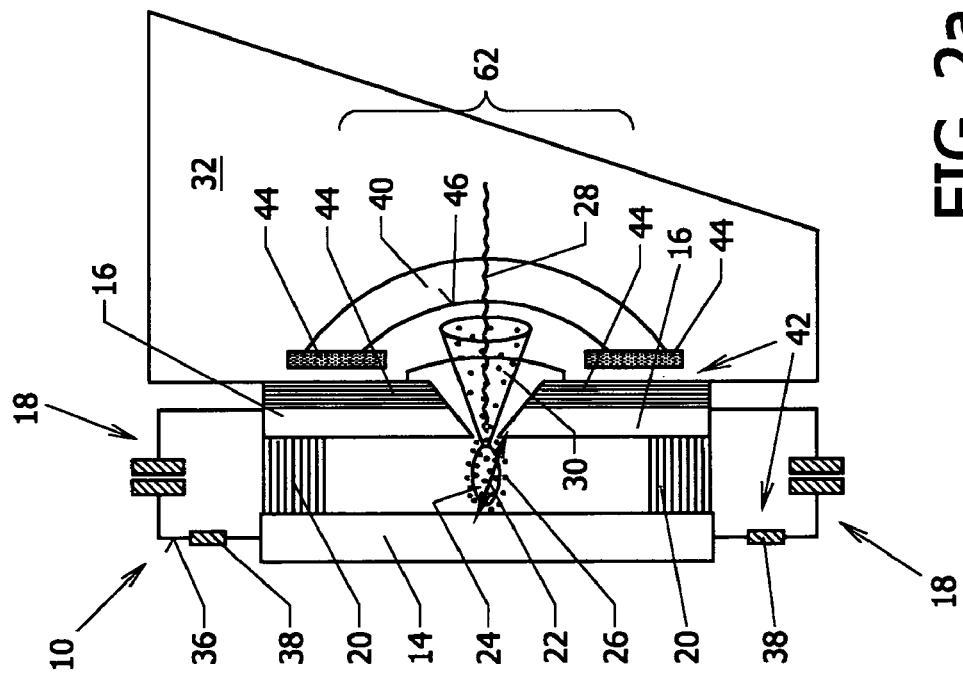
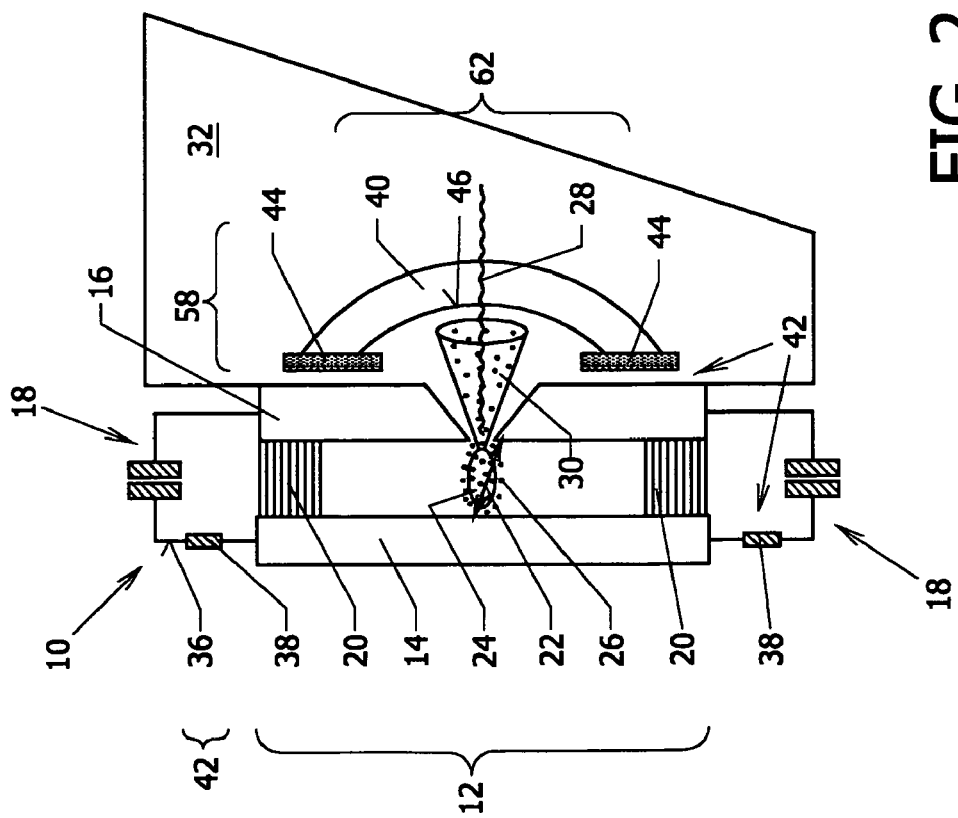

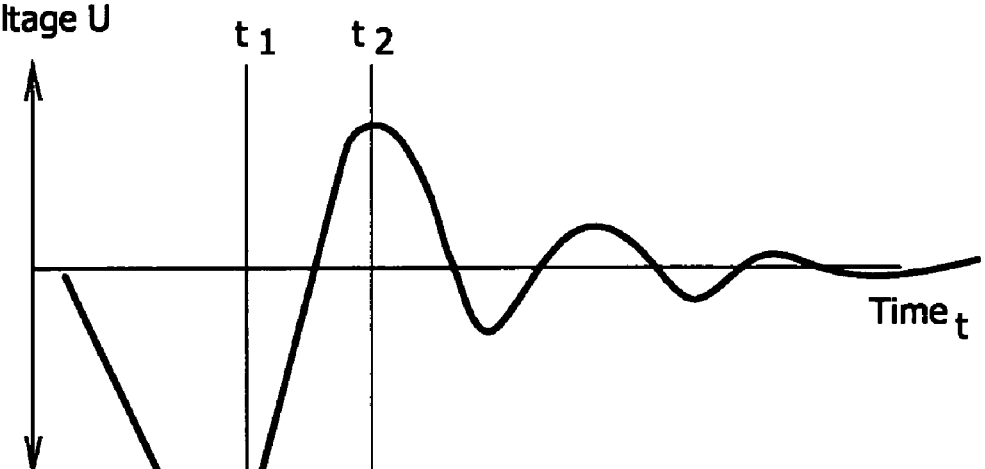
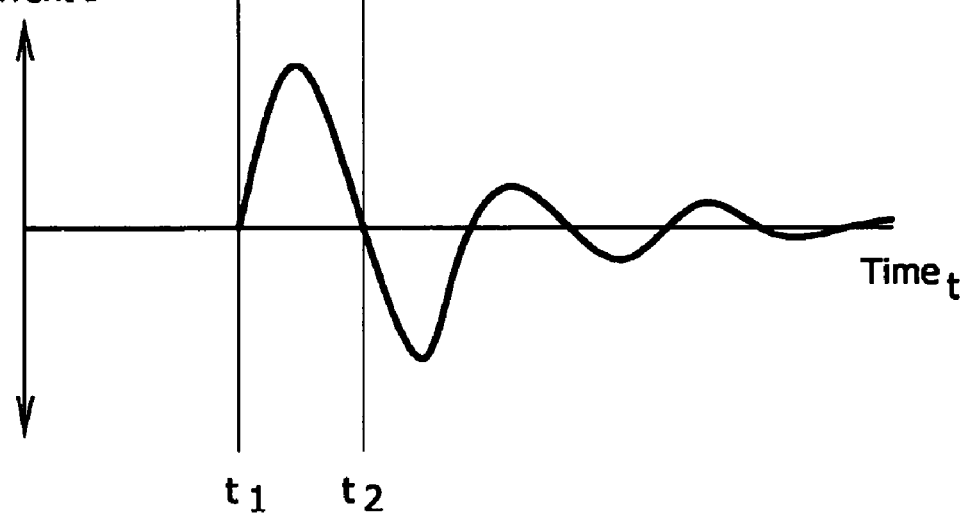
FIG. 8
(Prior art)

METHOD AND APPARATUS FOR OPERATING AN ELECTRICAL DISCHARGE DEVICE

The present invention relates to a method of operating an electrical discharge device, having the features as claimed in the preamble of claim 1.

The present invention also relates to an apparatus for operating an electrical discharge device, as claimed in the preamble of claim 9.

Such a method and a generic apparatus are known from DE A 101 39 677. For the purpose of better understanding, reference will firstly be made to FIGS. 7 and 8. The references used therein are also used for the description of the present invention.

The known discharge device 12 has at least one first electrode 14 and at least one second electrode 16 at a distance therefrom. The two electrodes 14, 16 are electrically connected to a power supply 18.

According to the aforementioned DE A 101 39 677, the power supply 18 may in this case comprise a capacitor bank, the stored electrical energy of which transmits an electrical current I upon ignition of a first gas discharge 22. Another power supply 18 is known from EP 0 894 349 B1. A pulse power generating circuit disclosed therein has a mismatch correction circuit which eliminates any energy of for example a gas discharge laser which flows back. As a result, electrode erosion can be minimized.

By transmitting the electrical current I between the electrodes 14, 16, a plasma 24 is produced in a working gas 26. The plasma 24 emits radiation 28, in particular extreme ultraviolet and/or soft X-ray radiation. The radiation 28 is passed via a solid angle 30 into a chamber 32 outside the electrodes 14, 16, said chamber 32 usually being referred to as a vacuum chamber.

Here, a secondary plasma 34 occurs in the chamber 32 in particular after the plasma 24 has been extinguished. The secondary plasma 34 is transmitted by means of a current flow 36 between the second electrode 16 facing the chamber 32 and an optical device 40. The optical device 40 is in the simplest case a wall of the vacuum chamber which delimits the chamber 32 and is acted upon by the radiation 28. The current flow 36 may be both particles of the working gas 26 and also electrode material removed from the electrodes 14, 16. Such particles may pass with the radiation 28 via the solid angle 30 into the chamber 32. When such particles absorb extreme ultraviolet and/or soft X-ray radiation, ions are produced which permit the current flow 36.

If, for example, the power supply 18 transmits the electrical energy in pulsed form, that is to say with a voltage U or current intensity I which varies over time, as shown in FIG. 8, sufficient electrical energy flows to ignite the secondary plasma 34.

FIG. 8a shows the voltage U between the electrodes 14, 16 over the time t. Up to the time $t_1$, a potential is applied to the electrodes 14, 16 by the power supply 18, until a predefined operating point of the discharge device 12 is reached. With the start of the first gas discharge 22, at the time $t_1$, as shown in FIG. 8b, a current I will flow between the electrodes 14, 16. The current I rises to a maximum value on account of an increasingly large number of charge carriers. The current I of the first gas discharge 22 then decreases until it touches the abscissa at the time $t_2$. The plasma 24 will occur only in the time interval between $t_1$ and $t_2$. Without wishing to restrict the present invention to a specific theory, a reversal of the polarity of the electrodes 14, 16 occurs after the time $t_2$ on account of an impedance difference between the discharge device 12 and the capacitor bank which serves as power supply 18.

As can be seen from FIGS. 8a and 8b, a damped sinusoidal oscillation then occurs between the electrodes 14, 16.

The secondary plasma 34 then occurs, depending on the polarity of the second electrode 16, next to the optical device 40, as shown in FIG. 7, or next to the second electrode 16. The secondary plasma 34 may in the first case cause considerable damage to the optical device 40 or in the second case may cause additional erosion at the second electrode 16.

As a result, a material deposit, so-called "sputtering", or extreme heating by a current origin may occur in particular on sensitive surfaces of the optical device 40, so that corresponding damage to the optical device 40 may be found. These phenomena lead to a shortening of the service life both of the optical device 40 and of the electrodes 14, 16.

Furthermore, the above-described reversal of the polarity of the electrodes 14, 16 leads to a return of electrical energy in the range from about 10% to 50% to the power supply 18. This energy which flows back must be converted for example into thermal energy, wherein a considerable heat load may arise. Moreover, a multiple of the time interval $t_1$ to $t_2$ is required until another first gas discharge 22 can be generated. As a result, a repetition rate for forming the plasma 24 is consequently also reduced.

It is therefore an object of the invention to provide a method having the abovementioned features which avoids the abovementioned disadvantages using technically simple means.

According to the invention, this object is achieved in a method of the type mentioned above in that the formation of a secondary plasma in the chamber is suppressed.

It is particularly important here that the operating point for forming the secondary plasma can rarely be reached during operation of the discharge device. To this end, it is possible to adapt, by means of the embodiments of the method according to the invention which are described in more detail below, in particular the voltage and pressure conditions in the chamber and a distance between current-carrying parts of the chamber.

According to one advantageous embodiment of the method, it is provided that a current flow between at least one of the electrodes and the power supply is limited by an electrical component and/or between the electrodes and an optical device in the chamber is interrupted by a second insulator. Here, use may be made of an electrical component connected in series, which is known in particular to a person skilled in the art of high-voltage engineering. By way of example, the electrical component may be a consumer, which converts the electrical energy when the current flow is reversed. Damping of the voltage and current oscillation between the electrodes is consequently achieved A sufficiently high voltage amplitude on the electrode which faces toward the chamber thus occurs more rarely, so that the secondary plasma extinguishes at least relatively quickly.

By means of the second insulator, a transfer of electrical energy for forming the secondary plasma can be suppressed even at high voltage amplitudes above the operating point for the secondary plasma.

One particularly advantageous embodiment of the method provides that at least one current path running parallel to the electrodes is activated by means of a switching element. The switching element may change its switching state both when the polarity of one of the electrodes is reversed and when the intensity of the radiation falls below a predefinable level. The current path is in particular provided with active and/or passive components so that the current path has a lower impedance than a possible current flow in the chamber. The electrical energy which remains at the end of the first gas discharge in the discharge device can very quickly be diverted or eliminated. In this case, too, the electrical energy required to produce and/or maintain the secondary plasma is removed.

The method may advantageously be configured such that at least a quantity of the working gas and/or of a buffer gas is predefined by means of a metering unit. The radiation generated by the plasma exits via an opening into the chamber. The opening is arranged between the chamber and a volume which is at least partially delimited by the electrodes. The plasma and the opening in this case define the size and orientation of the solid angle. Through this opening, it is possible for both particles of the working gas and material produced by electrode erosion to pass into the chamber. Typically, the same pressure conditions can be set in the volume and in the chamber. Since the radiation in the chamber has usually traveled a relatively great distance, use is made of a buffer gas which is relatively transparent to this radiation, that is to say a buffer gas which has a low absorption coefficient. If, in particular, the partial pressure of the buffer gas is reduced, the operating point for the secondary plasma will of course be shifted toward higher potential differences, according to Paschen's law.

Particularly in the case of a high partial pressure for the buffer gas, the amount of working gas which moves in the direction of the chamber may be limited. At an increased partial pressure, any ions which occur are hindered on account of a shorter free central distance on an efficient current flow toward the second plasma. The ions of course must be delayed in terms of their direction of advance.

One particularly advantageous embodiment of the method therefore provides that a magnetic field and/or an electric field is generated by means of a deflection device in a direction transverse to the radiation. The deflection device may in particular prevent sputtering onto the optical device by thermal ions, that is to say ions with a high pulse. The ions and electrons are accelerated in a different spatial direction. Such deflection devices for ions are known in particular to the person skilled in the art in the field of particle physics and/or mass spectrometry. Of course, use may also be made of an electric field which can be combined with the magnetic field.

One particularly advantageous embodiment of the method provides that impedance matching of the first gas discharge is carried out via a potential control device between the electrodes. When the electrical current is transmitted between the electrodes, the plasma is brought to temperatures of a few tens of electronvolts by virtue of resistance heating and electromagnetic compression. In the process, a plasma filament forms between the electrodes. The discharge device is then to be regarded as an RCL resonant circuit. Here, R stands for the resistance of the electrodes, C stands for a capacitor formed by the electrodes and L stands for the inductance of the first gas discharge or of the plasma filament. The impedance of the discharge device may be matched to the impedance of the power supply such that an overswing, that is to say a current and voltage oscillation at the end of the gas discharge, is prevented.

To this end, use may be made in particular of means which affect the resistance, inductance and/or capacitance of the plasma filament.

In a further advantageous embodiment of the method, it is provided that a discharge gap is defined which is shorter than a distance between at least one of the electrodes and an optical device which can be acted upon by the radiation. Of course, according to Kirchoff's law, in a parallel circuit a relatively large partial current flows over an electrically conductive branch which has the lower resistance. Consequently, if the electrical energy transmitted in the discharge device is offered a further current path of high conductivity, a large part of the electrical energy which is otherwise available for the secondary plasma can be removed via the discharge gap. In other words, the discharge gap in the simplest case is virtually a short-circuit.

It is particularly advantageous for the method that the secondary plasma is suppressed at or after the end of the first gas discharge. In this case, the abovementioned measures may be combined such that the first gas discharge which generates the plasma is optimally supplied with electrical energy. Excess electrical energy can then be rapidly eliminated. In particular, it is possible here to reduce the thermal loading of the electrodes. The excess electrical energy in this case does not flow back via the first gas discharge when the current is reversed. The electrodes in this case reach a zero potential particularly quickly, so that moreover a higher frequency for generating the plasma can be reached.

According to the invention, the object in terms of an apparatus for operating an electrical discharge device is moreover achieved in that there is provided at least one device for suppressing a secondary plasma in the chamber.

The device is in particular configured with the means described below such that it is possible to adapt the voltage (U) required to form the secondary plasma, a pressure (p) and/or a number of ions in the chamber. Furthermore, the device may change a distance between electrically conductive components of the chamber. The device essentially serves to prevent an operating point for the secondary plasma from being reached or to shift said operating point.

One particularly advantageous apparatus is configured such that the device for interrupting or limiting a current flow between at least one of the electrodes and the power supply comprises an electrical component and/or between the electrodes and an optical device comprises a second insulator. When the electrical current is transmitted between the electrodes, in particular excess electrical energy may flow back into the power supply. As a result, this may lead both to a reversal of polarity of the power supply and also to considerable thermal loading of the power supply. An electrical component connected in series with the latter can block or convert a returning current. The electrical component may of course also comprise a parallel connection of a number of electrical elements.

Naturally, the electrical energy must be transferred from the electrodes into the secondary plasma. By means of the second insulator, the transfer of electrical energy into the secondary plasma can be reduced virtually to zero.

According to one particularly advantageous embodiment of the apparatus, it is provided that the device comprises a current path connected in parallel with the electrodes, which current path can be activated by means of a switching element. The electrical energy introduced into the electrical discharge device is in this case passed via a bypass, which in particular has a lower impedance than the first gas discharge. Transmission of the electrical energy back via the gas discharge is prevented, so that additional thermal loading in the region of the electrodes acted upon by the first gas discharge is suppressed. To this end, the switching element has a threshold value which is below the ignition voltage for the secondary plasma. The threshold value may of course be varied during operation of the discharge device. By means of a photodiode in the chamber, any occurrence of the secondary plasma can be detected, so that the threshold value of the switching element can be adapted via a control system.

One particularly advantageous apparatus for operating an electrical discharge device is configured such that the device is provided with a metering unit, by means of which at least a quantity of the working gas and/or of a buffer gas between the electrodes and/or in the chamber can be predefined. For the particularly efficient conversion of the electrical energy transmitted into the plasma, the working gas used may be for example xenon, tin or iodine and chemical compounds thereof. Such substances introduced between the electrodes may pass into the chamber along with the radiation via an opening which defines the solid angle. Migration of the working gas into the chamber can be prevented by means of a buffer gas which is essentially transparent to EUV and/or soft X-ray radiation. Particularly on account of interactions between the short-wave radiation and particles of the working gas and the buffer gas, charge carriers may occur in the chamber, which charge carriers give rise to the current flow in the secondary plasma. By means of the metering unit, a partial pressure can be set both for the working gas and for the buffer gas in such a way that, under otherwise constant conditions in the chamber, the operating point of the secondary plasma is shifted toward higher ignition voltages. Moreover, by means of the metering unit, a ratio of working gas to buffer gas can be set, in which an optimal radiation intensity on the one hand and as low as possible a concentration of particles of the working gas on the other hand occur in the chamber.

One particularly advantageous embodiment of the invention provides that the device has a deflection device, the magnetic field and/or electric field of which can be oriented transversely to the radiation. The charge carriers passing into the chamber, which may give rise to a secondary plasma, interact with the magnetic field and/or the electric field. These charge carriers are for example delayed and/or accelerated transversely to the propagation direction of the radiation. The current flow provided by the charge carriers is at least deflected and may lead to a lengthening of the distance. The magnetic field may for example be provided by coils or permanent magnets. The electric field can be generated by means of deflection plates, as are known from electron tubes, or the like.

According to one particularly advantageous embodiment of the apparatus, it may be provided that the device for impedance matching of the first gas discharge has a potential control device arranged between the electrodes. When current is transported via the first gas discharge, an RCL resonant circuit is excited with formation of the plasma. By means of the potential control device, it is possible to influence an electric field between the electrodes in such a way that in particular the plasma filament can be changed in terms of its length and/or position with respect to the electrodes. As a result, it is possible to achieve in particular a change in terms of the electrical resistance (R) of the plasma, so that the impedance of the discharge device can be matched to the impedance of the power supply in the event of plasma formation. Consequently, a greatly reduced current and voltage oscillation occurs between the electrodes.

The apparatus according to the invention may advantageously be designed such that, by means of the device, a discharge gap can be defined which is shorter than a distance between at least one of the electrodes and an optical device which can be acted upon by the radiation. The discharge gap may in this case in particular be of lower impedance than the first gas discharge, so that excess electrical energy of the discharge device can be removed via the discharge gap. The discharge gap moreover has a lower resistance (R) than the current flow in the secondary plasma, which current flow is arranged in the chamber and is connected in parallel with the discharge gap. The discharge gap, which virtually serves as a short-circuit, carries most of the current which would otherwise usually flow in the secondary plasma. A current origin on the optical device is suppressed, which current origin usually has very high temperatures. In particular, less damage caused by thermal loading occurs on the optical devices.

One advantageous apparatus is configured such that the device can be activated at or after the end of the first gas discharge. It is particularly important for the invention here that the formation of the secondary plasma in the chamber is observed after the plasma has been generated. The device may consequently be configured such that the discharge device is designed essentially to optimally generate the radiation until the plasma is extinguished. The device then serves to reduce a current flow in the secondary plasma, to reduce particles in the chamber and/or to extend a current path in the secondary plasma. To this end, the device can be activated for example via a measurement and control circuit. The measurement circuit may detect both electrical and optical variables. The electrical variable may be for example the voltage U between the electrodes or a current I between power supply and discharge device. The optical variable used may be an intensity of the radiation of the plasma or any radiation of the secondary plasma which occurs.

The apparatus according to the invention may moreover advantageously be configured such that the electrical component is at least one diode, a diode array, a rectifier, a resistor or a combination thereof, as a result of which the current flow in the direction toward the power supply can be blocked and/or electrical energy can be converted via the resistor. By virtue of the diode, the diode array or the rectifier, current transport can be suppressed exclusively in the direction toward the power supply, whereas the current flow in the direction toward the discharge device is hardly affected. Such electrical components may be designed as conventional electron tubes or semiconductor components. The resistor may in this case be dimensioned such that both the above-described negative current/voltage characteristic of the discharge device can be compensated and also sufficient power is removed via the resistor to protect the power supply. The combination of such electrical components may lead to technically simpler handling of partial currents, in particular by connecting the electrical components in parallel.

Another advantageous apparatus is obtained if the second insulator is arranged between the electrodes and the chamber and/or between the chamber and a side of the optical device which is acted upon by the radiation. The second insulator may in the simplest case be a wall between the electrodes and the chamber which consists of a heat-resistant, non-electrically conductive material, with the opening being provided in said wall. The second insulator, which is made of a highly resistant ceramic, may also cover a part of the electrodes which otherwise at least partially delimits the chamber. The second insulator may also be arranged between the optical device and a holder which serves to position the optical device. As a result, in particular the side which is acted upon by the radiation can be protected against damage caused by a high current flow, for example by means of an extremely smooth molybdenum coating.

In a further apparatus, it is advantageously possible that the current path is formed in a wired manner outside the discharge device or in a wireless manner between the electrodes as a second gas discharge. In particular, the bypass described above as a current path may be arranged outside the discharge device by means of electrical conductors, such as cables for example. The current path must in this case be spatially separate from the discharge device in such a way that it is possible to handle even extremely high electrical energies. By means of the second gas discharge, it is possible to create between the electrodes a current path which passes the electrical energy back to a cathode within a very short time, in a manner almost similar to a short-circuit.

One particularly advantageous embodiment of the apparatus provides that the second gas discharge can be generated by means of a laser beam oriented toward one of the electrodes. The laser beam may for this purpose be oriented toward a surface which faces toward the first gas discharge. When the laser beam strikes following a reversal of polarity of the electrodes, it induces the occurrence of charge carriers for the second gas discharge and a return of the remaining electrical energy. The laser beam may in particular be oriented toward one of the electrodes outside a region which is acted upon by the first gas discharge. As a result, in particular better distribution of the thermal loading of the electrodes is possible in the case of wireless energy transmission.

One advantageous embodiment of the apparatus provides that the current path has a number of switching elements connected in parallel with one another and at least one passive electrical element, such as a coil, a resistor and/or a capacitor. As a result, in particular the wired current path can be adapted in terms of its electrical properties to properties of the discharge device. By means of the passive electrical element, the bypass can also be matched to the impedance of the discharge device during operation of the latter, so that the current and voltage oscillation is at least considerably damped after the end of the first gas discharge.

Advantageously, one embodiment of the apparatus provides that the switching element is a mechanical switch and/or an active electrical circuit consisting of at least one diode, a rectifier, a transistor, a spark switch or the like. The switching element may in this case be designed such that it also reliably allows the current flow via the current path even in the case of first gas discharges that are temporally only very short and in the case of pulsed operation of the discharge device, in particular with high repetition rates. Such switching elements are efficient in the form of semiconductors and permit reliable activation of the current path even at high frequencies in the kilohertz range. In the case of extremely high current flows, such semiconductors may also be used in a parallel circuit.

The apparatus according to the invention may moreover advantageously be designed such that the metering unit is a filter which is arranged between the chamber and the electrodes and is essentially transparent to the radiation, and/or a supply line for buffer and/or working gas which opens between the electrodes and/or in the chamber, and/or a pump, and/or an energy source which intermittently provides the working gas between the electrodes. The filter may to this end be arranged in the solid angle, so that most of the particles of the working gas are retained before entering the chamber. Such particles and the ions thereof are consequently rarely then available for forming a secondary plasma. Via the supply line, it is possible both for the quantity of buffer and/or working gas to be adapted and for a flow direction for such particles to be set. Via the pump, it is likewise possible to set the flow direction in particular transversely to the propagation direction of the radiation, even during operation of the discharge device. In order to further suppress the formation of the secondary plasma, a material which can be supplied and removed via the electrodes and which provides the working gas can be vaporized for example by supplying heat. In this case, a quantity of particles of the working gas in the discharge device has to be reduced.

One particularly advantageous apparatus provides that the deflection device is arranged in the chamber and the magnetic field and/or the electric field can be generated by means of a dipole, quadrupole or the like, so that in particular charged particles of the working gas and/or buffer gas are delayed and/or removed. The deflection device may in particular be arranged around the solid angle, in order to delay generated ions by virtue of interaction between particles of the working gas and buffer gas with the radiation. In this case, at least a rectilinear translation movement of conductors of the second type which is brought about by the current flow in the secondary plasma can be changed such that the distance between the electrodes and the optical device is extended. Electrically conductive plates, bars, etc. which are used to generate the electric field may neutralize or discharge ions as they occur.

One particularly advantageous apparatus for impedance matching of the discharge device provides that the potential control device has a plate which can be positioned in a stationary or variable manner in spatial terms with respect to the electrodes. As a result particularly during the formation of the plasma, a plasma filament that is produced can be manipulated in terms of its electrical properties in order to adapt the impedance thereof to the impedance of the power supply and/or of the current path.

The invention will be further described with reference to examples of embodiments shown in the drawings to which, however, the invention is not restricted.

FIG. 2 shows a cross section of a second example of embodiment of the apparatus according to the invention.

FIG. 2a shows a cross section of a third apparatus according to the present invention.

Figure 7:
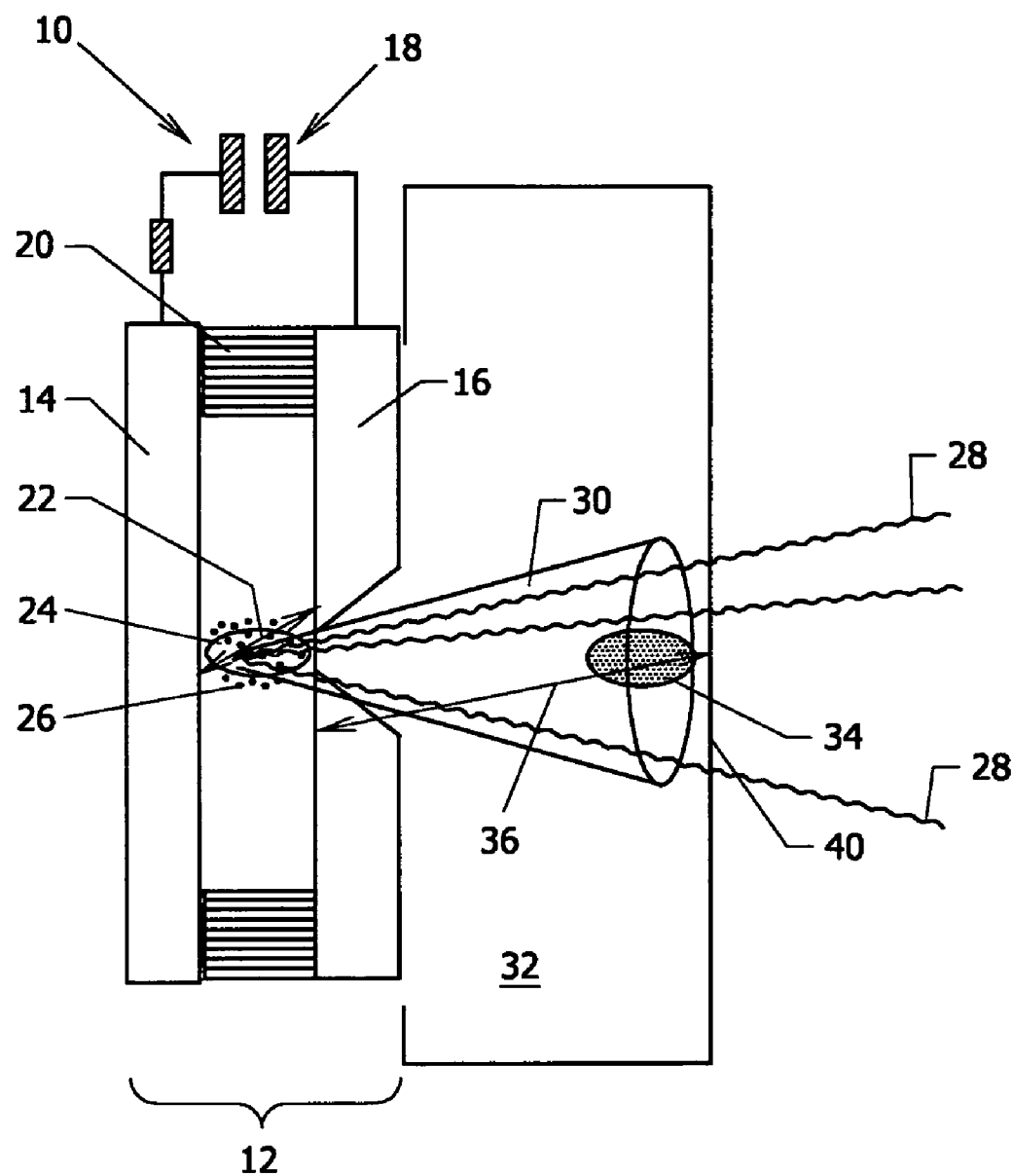
FIG. 7 shows a schematic diagram of a generic apparatus according to the prior art.

FIGS. 8a, b show diagrams in which a voltage or a current between the electrodes is plotted against time, according to the apparatus shown in FIG. 7.

In the following description of the examples of embodiments, identical references denote at least similar design features and, unless otherwise specified below, always relate to FIGS. 1 to 6.

Figure 1:
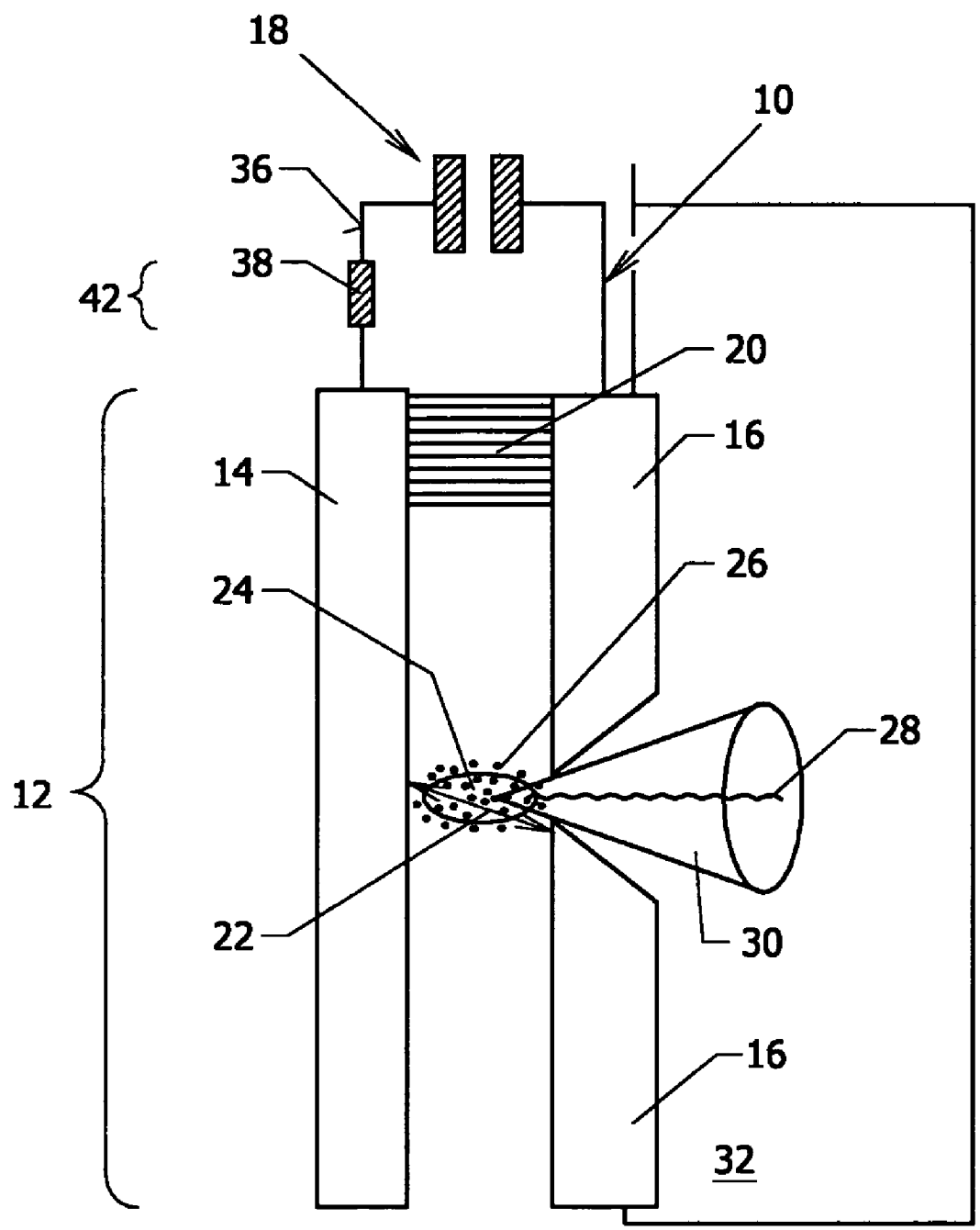
FIG. 1 shows a side view of a first apparatus for operating an electrical discharge device.

FIG. 1 shows an apparatus 10 for operating an electrical discharge device 12 which comprises a first electrode 14 and a second electrode 16 at a distance therefrom. The electrodes 14, 16 are electrically connected to a power supply 18. The power supply 18 provides electrical energy which transmits an electrical current I upon ignition of a first gas discharge 22 between the electrodes 14, 16. In a working gas 26 present between the electrodes 14, 16, a plasma 24 is generated by means of electromagnetic compression, which plasma emits radiation 28, in particular extreme ultraviolet and/or soft X-ray radiation—hereinafter referred to as EUV for short. The radiation 28 generated by the plasma 24 is passed via a solid angle 30 into a chamber 32 outside the electrodes 14, 16. The chamber 32 is designed as a so-called vacuum chamber in order to prevent absorption phenomena. On account of differences in impedance between the power supply 18 and the discharge device 12, the polarity of the electrodes 14, 16 is reversed. In order to suppress a current flow 36 between the second electrode 16 and a part delimiting the chamber 32, with the formation of a secondary plasma 34, a device 42 is provided between the first electrode 14 and the power supply 18. The device 42 has an electrical component 38 connected in series in order to limit a current flow 34 (not shown here) in the secondary plasma 38, as shown in FIG. 7. The electrical component 38 connected between the first electrode 14 and the power supply 18 is for example a cooled high-power resistor which takes up the electrical energy stored in the discharge device 12 and converts it into heat. As a result, the electrical energy required to form the secondary plasma 34 is at least partially removed from the discharge device 12.

A resonant circuit formed by the power supply 18, the first gas discharge 22 or the plasma 24 and the electrical component 38 has to be damped by a resistance $R_1$. This resonant circuit can be described with an overall capacitance $C_S$, an overall inductance Ls and a resistance R. The electrical component 38, which as the resistance $R_1$ is connected in series with the power supply 18 and the electrode 16, can be selected here as $$R_1 = 2 \cdot \sqrt{\frac{L_S}{C_S}} - R$$

in order to achieve an aperiodic damping without reversal of current. If the resistance $R_1$ is dimensioned to be considerably larger, in order to divert within a very short time excess energy transmitted from the power supply 18 to the discharge device 12, most of the energy provided by the power supply 18 is not made available to the plasma 24. The electrical component 38 for example intermittently provides a resistance $R_1 = \infty$ via a diode. On the other hand, if the resistance $R_1$ is selected to be smaller, an overswing occurs as shown in FIG. 8.

In the second example of embodiment of an apparatus 10 according to the invention, which is shown in FIG. 2, the current flow 36 between the power supply 18 and the first electrode 14 is interrupted by a device 42. The electrical component 38, which is in this case connected in series, is a rectifier, a diode or a diode array which blocks the current flow 36. Considerable thermal loading due to the electrical energy stored in the discharge device 12 being transmitted back can be suppressed. In order to prevent the formation of a secondary plasma 34 in the chamber 32, the device 42 is provided with a second insulator 44. The second insulator 44 is arranged between the electrodes 14, 16 and an optical device 40 in the chamber 32. The electrical energy which remains in the discharge device 12 can in this case not be transmitted from one of the electrodes 14, 16 to the optical device 40. Consequently, since a current flow 36 between in particular the second electrode 16 and the optical device 40 which is arranged relatively close thereto in the chamber 32 cannot occur, the formation of the secondary plasma 34 is greatly inhibited. The second insulator 44 is in this case provided on a side 46 which is acted upon by the radiation 28.

The optical device 40 is designed as a filter 62 which is essentially transparent to the radiation 28. The filter 62 serves in particular to limit particles of the working gas 26 which pass over from the discharge device 12 to the chamber 32. The filter 62, which virtually serves as a metering unit 58, makes it possible to reduce a component which defines the operating point of the secondary plasma—in this case a particle density in the chamber 32—so that, under otherwise comparable conditions, during operation of the discharge device 12, the secondary plasma 34 in the chamber 32 is suppressed.

FIG. 2a shows a third example of embodiment of an apparatus 10. Another second insulator 44' is in this case arranged with respect to the second electrode 16 in such a way that a current flow 36 required for the formation of the secondary plasma 34 can be blocked both in the direction of the optical device 40 and also in the direction of a chamber wall which delimits the chamber 32. This second insulator 44' extends from the chamber wall to an opening of the second electrode 16 which delimits the solid angle 30. The discharge device 12 is thus electrically insulated from the chamber wall. Moreover, this second insulator 44' covers a part of the second electrode 16 which directly adjoins the chamber 32. A current flow 36 in the chamber 32 is thus suppressed, so that the formation of the secondary plasma 34 is prevented.

Figure 3A:
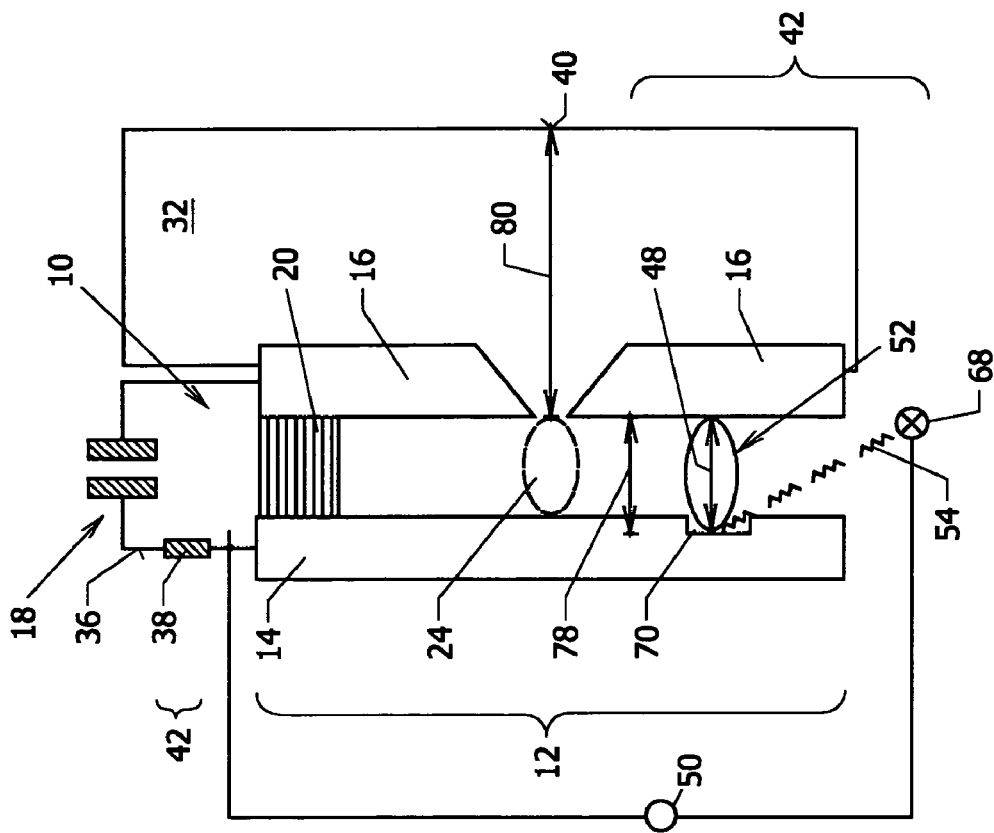
FIG. 3a shows a cross section of a fifth example of embodiment.
Figure 3:
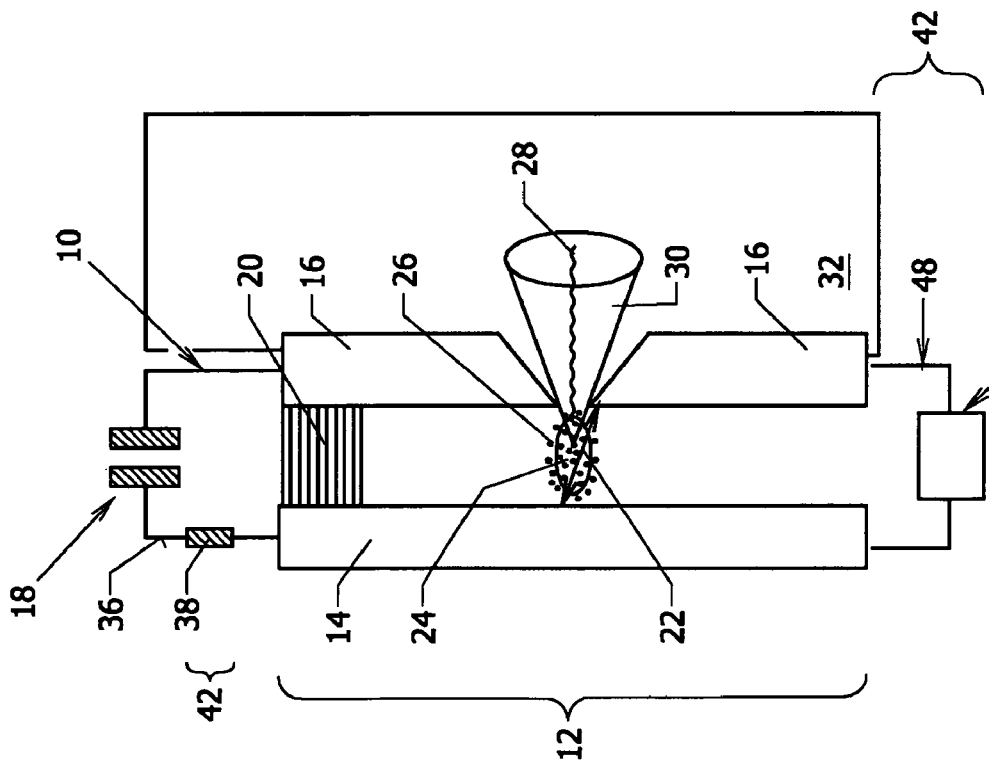
FIG. 3 shows a fourth example of embodiment of an apparatus, in side view.

According to a fourth example of embodiment of an apparatus 10 according to the invention, which is shown in FIG. 3, the electrical energy transmitted from the power supply 18 to the discharge device 12 is broken down relatively slowly by means of the electrical component 38. The device 42 is therefore expanded by a current path 48 which runs parallel to the electrodes 14, 16. In order to ensure a transfer of electrical energy between the electrodes 14, 16 via the first gas discharge 22, the current path 48 can be activated at least intermittently by a switching element 50. Particularly when the polarity of the electrodes 14, 16 is reversed, the switching element 50 can activate the current path 48, which serves almost as a short-circuit. The current path 48 is formed in a wired manner outside the discharge device 12, that is to say by means of electrically conductive cables. The switching element 50 is in the simplest case a mechanical switch or, depending on the level of the current or voltage amplitude between the electrodes 14, 16, a combination of a number of switching elements 50 connected in parallel with one another.

According to FIG. 3a, a fifth example of embodiment of an apparatus 10 is provided with a spark switch between the electrodes 14, 16. The spark switch provides an electrically conductive, wireless current path 48 parallel to the electrodes 14, 16. This current path 48 is formed in particular when the polarity of the electrodes 14, 16 is reversed. This current path 48 can in this case be defined by a cavity 70 which is spatially shifted with respect to the first gas discharge 22 in such a way that a current flow 36 passed via said current path prevents additional thermal loading of the electrodes 14, 16 in the region of the plasma 24.

This spark switch can be activated in a targeted manner by means of the device 42 for suppressing the secondary plasma 24 at or after the end of the first gas discharge 22. To this end, the switching element 50 is designed such that, as shown in FIG. 3a, it measures the current or voltage profile between power supply 18 and discharge device 12. Of course, the switching element 50 may also be designed to detect the radiation 28 or the secondary plasma 34 in the chamber 32. The switching element 50 actuates an energy source 68 at a given time. The energy beam of the latter is directed onto a surface of the electrodes 14, 16, in this case into a region of the cavity 70 of the first electrode 14, for example in the form of a laser beam 54. The energy beam generates a sufficient quantity of charge carriers to produce a second gas discharge 52. The current path 48 which can be generated in such a targeted way in this case has a lower impedance than a possible current path which allows a current flow 36 in the secondary plasma 34 in the chamber 32. The discharge gap 78 provided by the second gas discharge 52 is, as shown in FIG. 3a, considerably shorter than a distance 80 between at least one of the electrodes 14, 16 and an optical device 40 in the chamber 32 which can be acted upon by the radiation 28.

Figure 4:
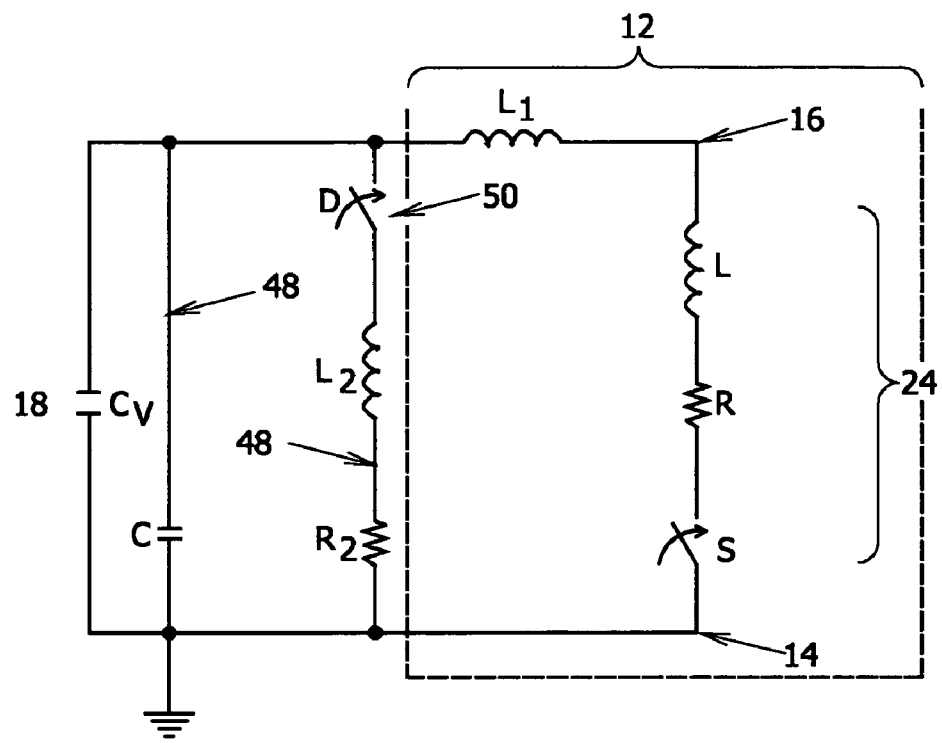
FIG. 4 shows a wiring diagram for a current path of the apparatus according to the invention.

FIG. 4 shows a sixth example of embodiment with a wired current path 48. On the right-hand side, the discharge device 12 is shown as a block diagram. The plasma 24 produced between the electrodes 14, 16 can be described by means of a switch S, a resistance R and an inductance L. Upon reaching the operating point, the plasma 24 forms by closure of the switch S, and this corresponds to ignition of the first gas discharge 22. In a high-current phase, a resonant circuit is formed by the power supply 18 with a capacitance $C_V$, the electrodes 14, 16 which are electrically connected thereto and the plasma 24. When the switching element 50 is open, this resonant circuit is defined by an overall capacitance $C_S=C_V+C$, a resistance R and an overall inductance $L_S=L_1+L$.

According to $$\omega_S = \frac{2\pi}{T_S} = \sqrt{\frac{1}{L_S \cdot C_S} - \frac{R^2}{4 \cdot L_S^2}}$$

this resonant circuit has a characteristic resonant frequency $\omega_S$, wherein $T_S$ is the period of oscillation of this resonant circuit.

A reversal of the current direction between the electrodes 14, 16 can be prevented by means of the current path 48 that can be switched by the switching element 50. The switching element 50 alternates from one to the other bistable condition at or around the zero point of the aforementioned equation at the time $t=t_D$. If the time $t=0$ is at plasma ignition, $t_D$ is approximately 0.25× the period of oscillation $T_S$ of this resonant circuit. After the end of the high-current phase or at the latest when the sign of the current flowing between the electrodes 14, 16 changes, the switching element 50 is then able to activate the switchable current path 48 in the closed state or to deactivate it in the open state.

Of course, the switching element 50 has a parasitic inductance. In the case of a parallel design of the switching element 50, for example consisting of a number of diodes D, thyristors, transistors and the like, the inductance is to be formed in the order of magnitude of less than 10 nH (nanoHenry). In order to relieve the load on the switching element 50, a saturable inductance $L_2$ is provided for example, which delays a rise in current at the switching moment. When the switching element 50 is closed, the saturable inductance L and the resistance $R_2$ with the overall capacitance $C_S$ form a further resonant circuit. The resistance $R_2$ provided in the switchable current path 48 then serves to damp both coupled resonant circuits.

The resistance $R_2$ is to be determined such that it is not greater than the resistance of the plasma 24, since otherwise the switchable current path 48 is highly resistive and a reversal of current takes place. In particular, in the case of a relatively large resistance $R_2$, a reversal of the current I flowing between the electrodes 14, 16 takes place at the time $t=0.5×$ period of oscillation $T_S$. If the resistance $R_2$ is too small, on the other hand, this results in a superposition of the two coupled resonant circuits described above. In this case, the excess energy flows like a beat to and fro between the resonant circuits, decaying only slowly.

An optimal value for the resistance $R_2$ can be determined for example by means of computer-aided simulation. The resistance $R_2$ and/or the resistance $R_1$ can of course also be designed to be variable in order to allow adjustment during operation of the discharge device 12.

The passive components thus serve to match the impedance of the current path 48 to the impedance of the discharge device 12. The electrical elements are combined so as to provide a current path 48 with a lower impedance than a current branch required to ignite the secondary plasma 34.

Figure 5:
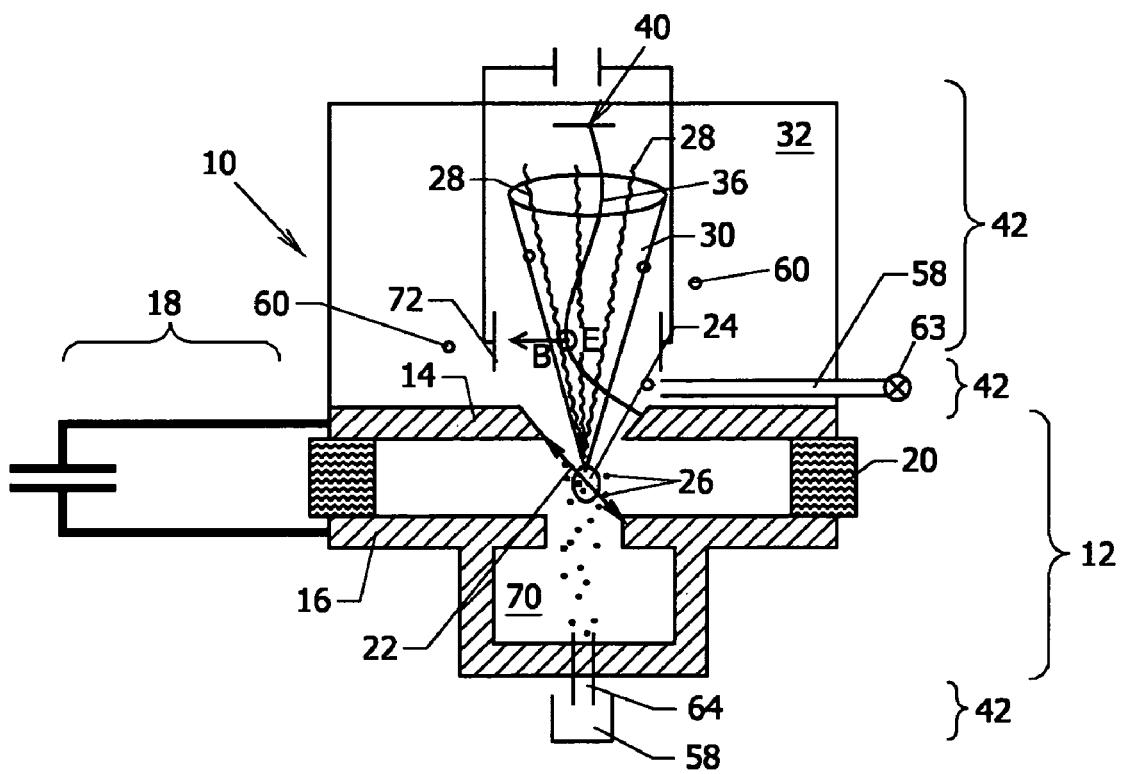
FIG. 5 shows a sixth example of embodiment for preventing a secondary plasma.

A seventh embodiment of the apparatus 10, which is illustrated in FIG. 5, shows a device 42 with a metering unit 58 for limiting in the chamber 32 a particle density—that is to say a pressure—which is required to form the secondary plasma 34. During operation of the apparatus 10, the metering unit 58 controls a quantity of working gas 26 in the cavity 70, via a supply line 64 which opens between the electrodes 14, 16. The second electrode 16 is designed in a sponge-like manner at least around the supply line 64. As a result, on the one hand an optimal quantity of working gas 26 for forming the plasma 24 can be provided and on the other hand a particle density of the working gas 26 in the chamber 32 can be kept as low as possible in order to suppress the formation of the secondary plasma 34.

A quantity of buffer gas 60 can be predefined by means of the metering unit 58 which opens into the chamber 32. Particles of the working gas 26 which pass into the chamber 32 can be removed by means of a pump 63. In other words, the metering unit 58 may define a partial pressure of the working gas 26 and/or of the buffer gas 60 in the chamber 32 such that, at otherwise customary voltage amplitudes between the electrodes 14, 16, an operating point for the formation of the secondary plasma 34 is not reached.

The radiation 28 passed into the chamber 32 via the solid angle 30 generates ions in particular when it interacts with particles of the working gas 60. These ions produce a current flow 36 for forming the secondary plasma 34. In order to delay and/or remove the ions required for the current flow 36, a magnetic field B oriented transversely to the radiation 28 and/or an electric field E running perpendicular thereto can be generated by means of a deflection device 72. The deflection device 72 is arranged in the chamber 32 in such a way that the magnetic field B is oriented such that an optical device arranged in the solid angle 30 is protected against ion bombardment and the formation of an adjacent secondary plasma 34. The electrically operated deflection device 72 shown here generates a dipole which makes it possible to remove in particular charged particles of the working gas 26 and/or buffer gas 60 also by means of a discharge. An electric field E generated here between the optical device 40 and the first electrode 14 weakens the electric field between the optical device 40 and the first electrode 14. By virtue of the magnetic field B, by deflecting the ions required for the current flow 36, said current flow 36 is at least extended, as shown by a curved line. As a result, the operating point for the formation of the secondary plasma 34 can be shifted toward higher potential differences.

Figure 6:
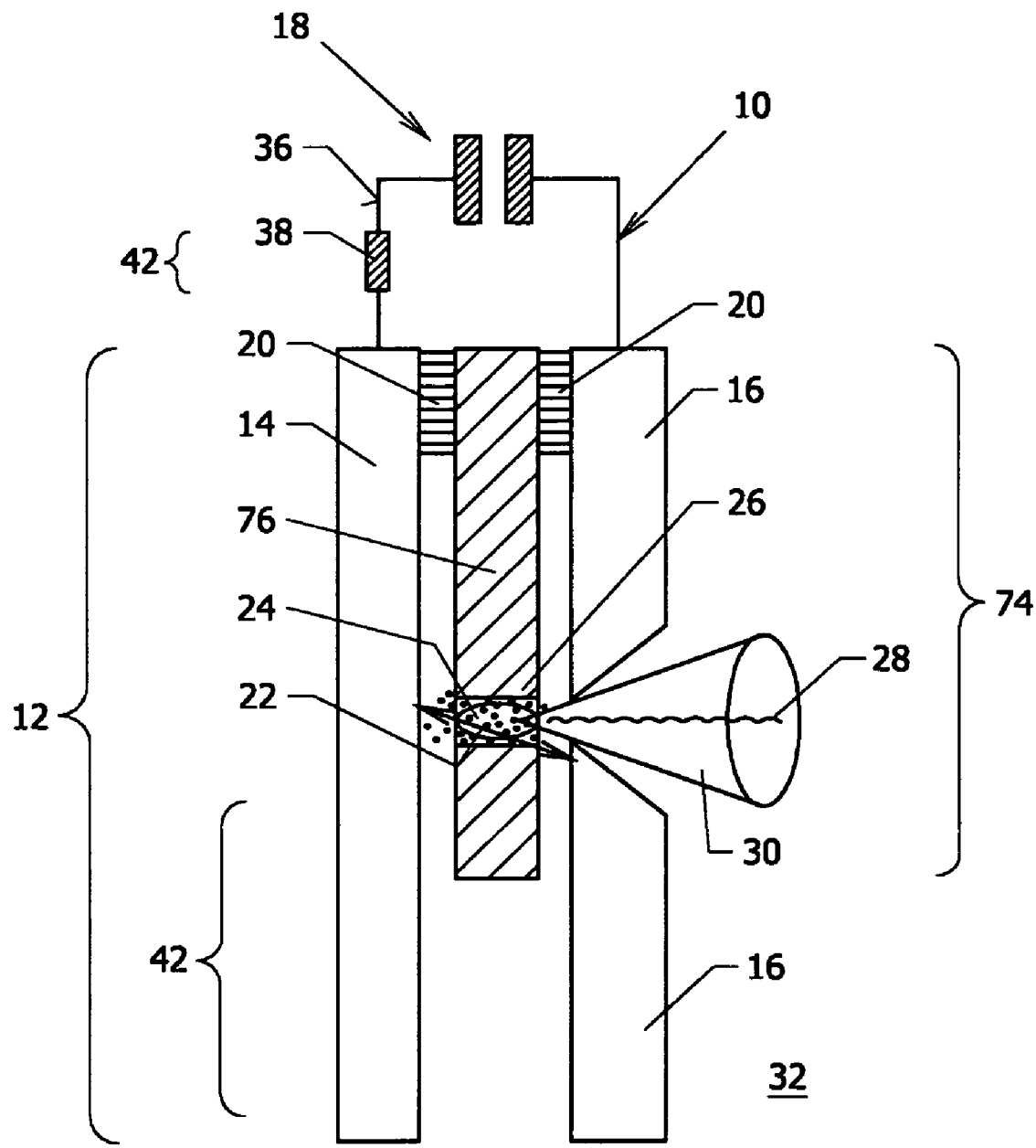
FIG. 6 shows a seventh example of embodiment of an apparatus according to the invention, in side view.

In order to prevent a voltage and current oscillation between the electrodes 14, 16 which is necessary for the formation of the secondary plasma 34, a device 42 shown in FIG. 6 may be used for an eighth example of embodiment.

Upon ignition of the first gas discharge 22 and in particular upon formation of the plasma 24, the discharge device 12 acts as an RCL resonant circuit. The impedance thereof during operation is different from the impedance of the power supply 18. The electrical energy transmitted by the power supply 18 naturally leads, on account of the difference in impedance, to a current and voltage oscillation as shown in FIG. 8 and as described in more detail above, which promotes the formation of a secondary plasma 34.

The device 42 for suppressing the secondary plasma 34 in the chamber 32 is designed in the form of a potential control device 74. The potential control device 74, by means of a plate 76 which can be positioned in a variable manner in spatial terms with respect to the electrodes 14, 16, allows matching of the impedance of the first gas discharge 22 to the impedance of the power supply 18. This can be achieved in a particularly simple manner by means of a hole. In particular, upon formation of the plasma 24, a plasma filament which is produced can be extended through said hole in such a way that the resistance thereof is increased. By means of an increased resistance R of the RCL resonant circuit of the discharge device 12, impedance matching with respect to the power supply 18 can consequently be achieved. An overswing of the RCL resonant circuit is prevented and less electrical energy is available for the formation of the secondary plasma 34.

The present invention relates to a method and an apparatus for operating an electrical discharge device which in particular produces a plasma which emits radiation in the EUV range. Herein, measures are proposed in particular in order to suppress the formation of a secondary plasma in the chamber. The measures provide means for limiting a current flow, for eliminating particles in the chamber and for changing a distance between current-carrying components. Consequently, means are disclosed which prevent it from being possible to reach an operating point for the secondary plasma during operation of the discharge device.

LIST OF REFERENCES 10 apparatus
12 discharge device
14 first electrode
16 second electrode
18 power supply
20 insulator
22 first gas discharge
24 plasma
26 working gas
28 radiation
30 solid angle
32 chamber
34 secondary plasma
36 current flow
38 electrical component
40 optical device
42 device
44,44' second insulator
46 side
48 current path
50 switching element
52 second gas discharge
54 laser beam
56 laser source
58 metering unit
60 buffer gas
62 filter
64 supply line
66 pump
68 energy source
70 cavity
72 deflection device
74 potential control device
76 plate
78 discharge gap
80 distance
B magnetic field
C capacitor
$C_S$, $C_V$ overall capacitance of resonant circuit, capacitance of power supply
D diode
E electric field
I current
L inductance of the first gas discharge or of the plasma
$L_n$ inductance, coil (n=1, 2, ...)
$L_S$ overall inductance of resonant circuit
p pressure
R resistance of the first gas discharge or of the plasma
$R_n$ resistance (n=1, 2, ...)
$R_S$ overall resistance of the resonant circuit
S switch
t time
$t_n$ time (n=0, 1, ...)

The invention claimed is:

1. A method of operating an electrical discharge device comprising at least one first electrode and at least one second electrode at a distance therefrom, which electrodes are electrically connected to a power supply and, upon ignition of a first gas discharge between the electrodes, transmit an electrical current, as a result of which a plasma is produced in a working gas, which plasma emits radiation, in particular extreme ultraviolet and/or soft X-ray radiation, which is passed via a solid angle into a chamber outside the electrodes, the method comprising suppressing a formation of a secondary plasma in the chamber.

2. A method as claimed in claim 1, wherein at least one of:
a current flow between at least one of the electrodes and the power supply is limited by an electrical component; and
a current flow between the electrodes and an optical device in the chamber is interrupted by a second insulator.

3. A method as claimed in claim 1 wherein at least one current path running parallel to the electrodes is activated by means of a switching element.

4. A method as claimed in claim 1, wherein at least a quantity of the working gas and/or of a buffer gas is predefined by means of a metering unit.

5. A method as claimed in claim 1, wherein a magnetic field and/or an electric field is generated by means of a deflection device in a direction transverse to the radiation.

6. A method as claimed in claim 1, further comprising matching an impedance of the electrical discharge device using a potential control device arranged between the electrodes.

7. A method as claimed in claim 1, wherein a discharge gap is defined which is shorter than a distance between at least one of the electrodes and an optical device which can be acted upon by the radiation.

8. A method as claimed in claim 1, wherein the secondary plasma is suppressed at or after the end of the first gas discharge.

9. An apparatus for operating an electrical discharge device comprising at least one first electrode and at least one second electrode at a distance therefrom, which electrodes are electrically connected to a power supply and, upon ignition of a first gas discharge, transmit an electrical current between the electrodes, as a result of which a plasma can be produced in a working gas, the emitted radiation of which plasma, in particular extreme ultraviolet and/or soft X-ray radiation, can be passed via a solid angle into a chamber outside the electrodes, the apparatus comprising at least one device for suppressing a formation of a secondary plasma in the chamber.

10. An apparatus as claimed in claim 9, wherein the at least one device comprises at least one of:
an electrical component for interrupting or limiting a current flow between at least one of the electrodes and the power supply; and
a second insulator for interrupting or limiting a current flow between the electrodes and an optical device.

11. An apparatus as claimed in claim 9, wherein the at least one device comprises a current path connected in parallel with the electrodes, and wherein the current path can be activated by a switching element.

12. An apparatus as claimed in claim 9, wherein the at least one device is provided with a metering unit, including means to predefine at least a quantity of the working gas and/or of a buffer gas between the electrodes and/or in the chamber.

13. An apparatus as claimed in claim 9, wherein the at least one device has a deflection device, such that at least one of the magnetic field and the electric field can be oriented transversely to the radiation.

14. An apparatus as claimed in claim 9, wherein the at least one device has a potential control device arranged between the electrodes.

15. An apparatus as claimed in claim 9, wherein the at least one device is employed to define a discharge gap which is shorter than a distance between at least one of the electrodes and an optical device which can be acted upon by the radiation.

16. An apparatus as claimed in claim 9, wherein the at least one device can be activated at or after the end of the first gas discharge.

17. An apparatus as claimed in claim 10, wherein the electrical component includes at least one diode, a diode array, a rectifier, a resistor or a combination thereof, and wherein at least one of: the current flow in the direction toward the power supply can be blocked; and electrical energy can be converted via the resistor.

18. An apparatus as claimed in claim 10, wherein the second insulator is arranged between at least one of:
the electrodes and the chamber; and
the chamber and a side of the optical device which is acted upon by the radiation.

19. An apparatus as claimed in claim 11, wherein the current path is formed in a wired manner outside the discharge device or in a wireless manner between the electrodes as a second gas discharge.

20. An apparatus as claimed in claim 11, wherein a second gas discharge can be generated by means of a laser beam oriented toward one of the electrodes.

21. An apparatus as claimed in claim 11, wherein the current path has a number of switching elements connected in parallel with one another and at least one passive electrical element, including any of a coil, a resistor and/or a capacitor.

22. An apparatus as claimed in claim 11, wherein the switching element includes at least one of:
a mechanical switch; and
an active electrical circuit including any of at least one diode, a rectifier, a transistor, or a spark switch.

23. An apparatus as claimed in claim 12, wherein the metering unit includes at least one of:
a filter which is arranged between the chamber and the electrodes and is essentially transparent to the radiation;
a supply line for the buffer gas and/or the working gas which opens between the electrodes and/or in the chamber;
a pump; and
an energy source which intermittently provides the working gas.

24. An apparatus as claimed in claim 13, wherein the deflection device is arranged in the chamber and wherein at least one of the magnetic field and the electric field can be generated by a dipole, or a quadrupole, to delay and/or remove charged particles of the working gas and/or the buffer gas.

25. An apparatus as claimed in claim 14, wherein the potential control device has a plate which can be positioned in a stationary or variable manner in spatial terms with respect to the electrodes.

* * * * *